United States Patent
Furuya et al.

(10) Patent No.: US 10,224,458 B2
(45) Date of Patent: Mar. 5, 2019

(54) GROUP III NITRIDE LAMINATE, LUMINESCENCE ELEMENT COMPRISING SAID LAMINATE, AND METHOD OF PRODUCING GROUP III NITRIDE LAMINATE

(71) Applicant: Stanley Electric Co., Ltd., Tokyo (JP)

(72) Inventors: Hiroshi Furuya, Yamaguchi (JP);
Toshiyuki Obata, Yamaguchi (JP);
Toru Kinoshita, Yamaguchi (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 15/552,500

(22) PCT Filed: Mar. 3, 2016

(86) PCT No.: PCT/JP2016/056551
§ 371 (c)(1),
(2) Date: Aug. 22, 2017

(87) PCT Pub. No.: WO2016/143653
PCT Pub. Date: Sep. 15, 2016

(65) Prior Publication Data
US 2018/0033913 A1 Feb. 1, 2018

(30) Foreign Application Priority Data
Mar. 6, 2015 (JP) .................. 2015-044164

(51) Int. Cl.
*H01L 33/12* (2010.01)
*H01L 33/16* (2010.01)
(Continued)

(52) U.S. Cl.
CPC .......... *H01L 33/12* (2013.01); *H01L 21/0254* (2013.01); *H01L 21/0262* (2013.01);
(Continued)

(58) Field of Classification Search
None
See application file for complete search history.

(56) References Cited

U.S. PATENT DOCUMENTS 7,939,889 B2 * 5/2011 Yu .................. H01L 29/66795
257/347
8,071,983 B2 * 12/2011 Brask ................ H01L 21/30608
257/66
(Continued)

FOREIGN PATENT DOCUMENTS

| JP | 2006295132 A | 10/2006 |
|---|---|---|
| JP | 2007184353 A | 7/2007 |

(Continued)

OTHER PUBLICATIONS

Ban et al., "Internal Quantum Efficiency of Whole-Composition-Range AlGaN Multiquantum Wells," Applied Physics Express 4, 052101-1 to 052101-3 (2011).

(Continued)

*Primary Examiner* — Bilkis Jahan
(74) *Attorney, Agent, or Firm* — Cahn & Samuels, LLP

(57) ABSTRACT

A group III nitride laminate includes, on an AlN single crystal substrate, a multilayer structure having an $Al_XGa_{1-X}N$ layer ($0<X\leq1$) that is lattice-matched to the AlN single crystal substrate, and wherein a GaN layer that has a film thickness of 5-400 nm and a dislocation density of less than $5\times10^{10}$ cm$^{-2}$ or a half width of the X-ray omega rocking curve of 50-300 seconds is laminated on the $Al_XGa_{1-X}N$ layer ($0<X\leq1$).

10 Claims, 2 Drawing Sheets

(51) Int. Cl.
  *H01L 33/32* (2010.01)
  *H01L 33/00* (2010.01)
  *H01L 21/02* (2006.01)
  *H01L 33/02* (2010.01)

(52) U.S. Cl.
  CPC .. *H01L 21/02389* (2013.01); *H01L 21/02458* (2013.01); *H01L 21/02505* (2013.01); *H01L 21/02576* (2013.01); *H01L 21/02579* (2013.01); *H01L 33/0075* (2013.01); *H01L 33/16* (2013.01); *H01L 33/32* (2013.01); *H01L 33/025* (2013.01)

(56) References Cited

U.S. PATENT DOCUMENTS

| | | | |
|---|---|---|---|
| 8,080,833 | B2 | 12/2011 | Grandusky et al. |
| 2004/0262699 | A1* | 12/2004 | Rios ................. H01L 29/66795 257/401 |
| 2007/0034883 | A1 | 2/2007 | Ohba |
| 2007/0054448 | A1* | 3/2007 | Choi ................. H01L 21/28273 438/201 |
| 2007/0075372 | A1* | 4/2007 | Terashima ........ H01L 29/42392 257/360 |
| 2007/0187682 | A1* | 8/2007 | Takeuchi ........ H01L 21/823807 257/64 |
| 2008/0187016 | A1* | 8/2008 | Schowalter ....... H01L 21/02389 372/45.011 |
| 2008/0296702 | A1* | 12/2008 | Lee ................. H01L 21/823431 257/401 |
| 2011/0095331 | A1 | 4/2011 | Hanawa et al. |
| 2012/0168753 | A1* | 7/2012 | Sanga .................... H01L 33/02 257/52 |
| 2014/0209923 | A1 | 7/2014 | Xie et al. |
| 2014/0346638 | A1 | 11/2014 | Koukitu et al. |
| 2016/0005919 | A1 | 1/2016 | Obata |

FOREIGN PATENT DOCUMENTS

| | | |
|---|---|---|
| JP | 2010517298 A | 5/2010 |
| JP | 2010263140 A | 11/2010 |
| JP | 2014154591 A | 8/2014 |
| JP | 2014241397 A | 12/2014 |
| NO | 2008094464 A2 | 8/2008 |
| TW | 201 332 151 A | 8/2013 |
| WO | 2012056928 A1 | 5/2012 |

OTHER PUBLICATIONS

Kumagai et al., "Preparation of a Freestanding AlN Substrate from a Thick AlN Layer Grown by Hydride Vapor Phase Epitaxy on a Bulk AlN Substrate Prepared by Physical Vapor Transport," Appl. Phys. Express 5, 055504-1 to 055504-3 (2012).
Colazzo et al., "Seeded Growth of AlN Bulk Crystals In m— and c-orientation," J. Cryst. Growth 312, 58-63 (2009).
Adivarahan et al., "Robust 290 mm Emission Light Emitting Diodes over Pulsed Laterally Ovegrgrown AlN," Jpn. J. Appl. Phys. vol. 46, L877-879 (2007).
Morishita et al., "Control of Growth Mode In Mg-doped GaN/AlN Heterostructure," Jpn. J. Appl. Phys. 53, 030305-1 to 030305-4 (2014).
International Search Report for PCT/JP2016/056551 dated May 24, 2016.
English Abstract of JP 2006295132.
English Abstract of JP 2007184353.
English Abstract of JP 2010263140.
English Abstract of JP 2014154591.
English Abstract of JP 2014241397.
English Abstract of WO 2012056928.
International Preliminary Report on Patentability for PCT/JP2016/056551 dated Sep. 21, 2017.
English abstract of TW 201 332 151 A, Aug. 1, 2013.

\* cited by examiner

GROUP III NITRIDE LAMINATE, LUMINESCENCE ELEMENT COMPRISING SAID LAMINATE, AND METHOD OF PRODUCING GROUP III NITRIDE LAMINATE

This application is a U.S. national stage application of PCT/JP2016/056551 filed on 3 Mar. 2016 and claims priority to Japanese patent document 2015-044164 filed on 6 Mar. 2015, the entireties of which are incorporated herein by reference.

TECHNICAL FIELD

The present invention relates to a novel group III nitride single laminate which can be applied to an ultraviolet ray emitting element, and also to a novel ultraviolet ray emitting element comprising said laminate.

BACKGROUND OF THE INVENTION

The group III nitride semiconductor expressed by $Al_aGa_{1-a}N$ ($0 \leq a \leq 1$) can regulate (modify) the composition of the group III element (aluminum (Al), gallium (Ga)), thereby the luminescence peak wavelength can be selected arbitrarily within the range of 210 to 365 nm; the band structure with a direct bandgap type is attained within the energy range corresponding to the above mentioned wavelength range, thus the group III nitride semiconductor is a most suitable material for forming ultraviolet ray emitting element.

The ultraviolet ray emitting element made of the group III nitride semiconductor is generally produced by carrying out a crystal growth of an $Al_aGa_{1-a}N$ layer on the single crystal substrate by a metal organic chemical vapor deposition method (MOCVD method) and molecular beam epitaxy method (MBE method). As the single crystal substrate, preferably the material having good matching lattice constant and matching thermal expansion coefficient with $Al_aGa_{1-a}N$ layer is used.

For example, non-patent articles 1 and 2 obtain the ultraviolet ray emitting element having the luminescence wavelength of 300 nm or less by growing an AlGaN layer using a sapphire as the substrate. The non-patent articles 1 and 2 disclose that the luminescence efficiency and the element lifetime are improved by reducing the dislocation density of the $Al_aGa_{1-a}N$ layer.

Also, in case of growing the $Al_aGa_{1-a}N$ layer ($0<a\leq1$) which includes Al, the aluminum nitride (AlN) single crystal layer is used to reduce the defect density in the $Al_aGa_{1-a}N$ layer including Al, and as an advantageous means for producing the highly efficient ultraviolet ray emitting element. For example, the patent document 1 discloses that the dislocation density in the $Al_aGa_{1-a}N$ layer can be reduced, and the ultraviolet ray emitting diode having a luminescence peak wavelength of 250 nm is obtained by producing the ultraviolet ray emitting diode including a laminate structure comprising the $Al_aGa_{1-a}N$ layer which is lattice matched with the AlN single crystal layer on the AlN single crystal substrate.

Also, the patent document 2 discloses the ultraviolet ray emitting element, wherein a cap layer which is substantially lattice relaxed, that is having substantially the same lattice constant as distortion free condition (the condition wherein the lattice relaxation rate is 100%), is provided on a similar structure (on the $Al_aGa_{1-a}N$ layer which is lattice matched). This patent document 2 discloses that by lattice relaxing the cap layer, the doping can be easily done, and the cap layer can be thickened, and also because a foundation layer is not influenced by the distortion of the cap layer, effects such as thickening of the $Al_aGa_{1-a}N$ layer as the foundation layer can be expected. Further, a p-type gallium nitride (GaN) layer, which is the cap layer thereof, has large difference of the lattice constant between the $Al_aGa_{1-a}N$ layer which is lattice matched with the AlN single crystal substrate, thus it discloses that this will grow on the $Al_aGa_{1-a}N$ layer by Stranski-Krastanov(SK) mode or Volmer-Weber(VW) mode. Due to this growth, during the initial growth stage, GaN is known to undergo three dimensional crystal growth such as forming an island.

Also, the non-patent document 3 discloses that in case the GaN layer is 100% lattice relaxed (in case the lattice relaxation rate of the GaN layer is 100%) wherein the GaN layer is grown on AlN layer formed on the sapphire substrate, then the island form crystalline having a height of 500 nm or so is formed which corresponds to 2 times or so of the designed value. Further, by using the nitrogen carrier gas during the growth of the GaN layer, the smoothness of the GaN layer is improved, and also the lattice relaxation rate of the GaN layer thereof was 75%. Also, the patent document 3 discloses the example of using nitrogen gas when growing GaN layer, wherein the ratio of nitrogen carrier gas is 0.5 or more, and the example shows the carrier gas ratio having 0.9 of nitrogen gas and 0.1 of hydrogen gas.

PRIOR ART

Patent Document

[Patent document 1] WO 2008/094464
[Patent document 2] U.S. Pat. No. 8,080,833
[Patent document 3] JP Patent Application Laid Open No. 2014-154591

Non-Patent Document

[Non-patent document 1] Appl. Phys. Express 4,052101 (2011)
[Non-patent document 2] Jpn.J.Appl.Phys. 46,L877 (2007)
[Non-patent document 3] Jpn.J.Appl.Phys. 53,030305 (2014)
[Non-patent document 4] J.Cryst.Growth 312,58-63 (2009)
[Non-patent document 5] Appl.Phys.Express 5,055504 (2011)

However, as the structure shown in the patent document 2, in case the lattice relaxation rate of the GaN layer is roughly 100%, even if the dislocation density of the $Al_aGa_{1-a}N$ layer as the foundation layer is reduced to $10^6$ $cm^{-2}$ or less, regardless of the dislocation density of said foundation layer, a high density dislocation of $5\times10^{10}$ $cm^{-2}$ or more is formed in the GaN layer, thus there was a room for improvement. As described in the non-patent document 3, the GaN layer having lattice relaxation rate of 100% may have poor smoothness, and caused to decrease the luminescence efficiency and the reliability of the ultraviolet ray emitting device, thus there was a room for improvement.

Further, as the method disclosed in the non-patent document 3, in case of using the nitrogen (carrier) gas for improving the smoothness, as discussed in the above, the lattice relaxation rate of the GaN layer is 75%. In this case, the lattice relaxation rate of the GaN layer is high, thus the dislocation density of the GaN layer cannot be sufficiently lowered, and caused to decrease the luminescence efficiency and the reliability of the ultraviolet ray emitting device, thus there was a room for improvement. Also, according to the examination by the present inventors, even in case the nitrogen (carrier) gas is used as in the patent document 3, the dislocation density of GaN layer was $5 \times 10^{10}$ cm$^{-2}$ or more.

The main cause influencing the internal quantum efficiency of the ultraviolet ray emitting element is the dislocation density in the active layer, and the dislocation density in the GaN layer is thought to have only little direct influence on the luminescence efficiency. However, the dislocation in the GaN layer may possibly be a leak pass of the current or the diffusion pass of the impurity such as electrode metal or so, thus from the point of improving the reliability, the GaN layer preferably has low dislocation density.

Therefore, the object of the present invention is to provide the group III nitride laminate comprising the laminate structure wherein the GaN layer is stacked on the $Al_XGa_{1-X}N$ layer ($0<X\leq1$) lattice matched with the AlN single crystal substrate, and said group III nitride laminate has high crystalline quality (good crystallinity and low dislocation density), and also has the GaN layer with good smoothness.

The present inventors have carried out keen examination to attain the above object. Specifically, the present inventors have examined the crystalline quality of $Al_XGa_{1-X}N$ layer ($0<X\leq1$) as the foundation layer, the layer constitution/composition on the AlN single crystal substrate, and the growth condition of the GaN layer. As a result, the present inventors have found that by producing the group III nitride laminate under a certain condition, composition and layer constitution, the laminate comprising the GaN layer having good crystalline quality, that is the dislocation density of less than $5 \times 10^{10}$ cm$^{-2}$ or the GaN layer having the full width at half maximum of X ray omega rocking curve of 300 seconds or less, can be obtained, thereby the present invention is attained.

That is, the first invention relates to a group III nitride laminate comprising a laminate structure wherein an $Al_XGa_{1-X}N$ layer ($0<X\leq1$) lattice matched with an AlN single crystal substrate is stacked on said AlN single crystal substrate, a GaN layer having a thickness of 5 to 400 nm is stacked on said $Al_XGa_{1-X}N$ layer ($0<X\leq1$), and a dislocation density of said GaN layer is less than $5 \times 10^{10}$ cm$^{-2}$, or a full width at half maximum of X ray omega rocking curve of (002) plane and that of (102) plane of said GaN layer are 50 to 300 seconds.

In the first invention, in order to produce the luminescence element with even higher reliability, preferably said $Al_XGa_{1-X}N$ layer ($0<X\leq1$) is made of plurality of layers, and among the layer of said plurality of layers, a layer of which said GaN layer is directly stacked is an $Al_ZGa_{1-Z}N$ layer ($0<Z\leq1$), and said laminate structure comprises an $Al_YGa_{1-Y}N$ layer ($0.7\leq Y\leq1$) having relatively large V/III ratio in between said AlN single crystal substrate and said $Al_ZGa_{1-Z}N$ layer ($0<Z\leq1$).

Also, in the first invention, in order to attain GaN layer having even higher crystallinity, the lattice relaxation rate of said GaN layer is preferably less than 75%.

Further, in order for applying the first invention to the ultraviolet ray emitting element wherein the luminescence peak wavelength exist within the rage of 210 to 350 nm, said GaN layer preferably includes Mg (magnesium); and at the boundary between said GaN layer and said $Al_XGa_{1-X}N$ layer ($0<X\leq1$) where said GaN layer is directly stacked, the Mg concentration profile is preferably at peak. Also, said AlN single crystal substrate has 25 cm$^{-1}$ or less of an absorption coefficient at a wavelength of 210 nm or more.

The second invention relates to the ultraviolet ray emitting element comprising the group III nitride laminate of the first invention having the luminescence peak wavelength of 210 to 350 nm.

According to the present invention, the group III nitride laminate comprising the GaN layer with a high crystalline quality can be applied to the semiconductor element such as luminescence element. As a result, for example, in case of producing the ultraviolet ray emitting element having the luminescence peak wavelength of 350 nm or less by the group III nitride laminate of the present invention, the element comprising high luminescence efficiency and the reliability can be obtained.

DETAILED DESCRIPTION OF INVENTION

Figure 1:
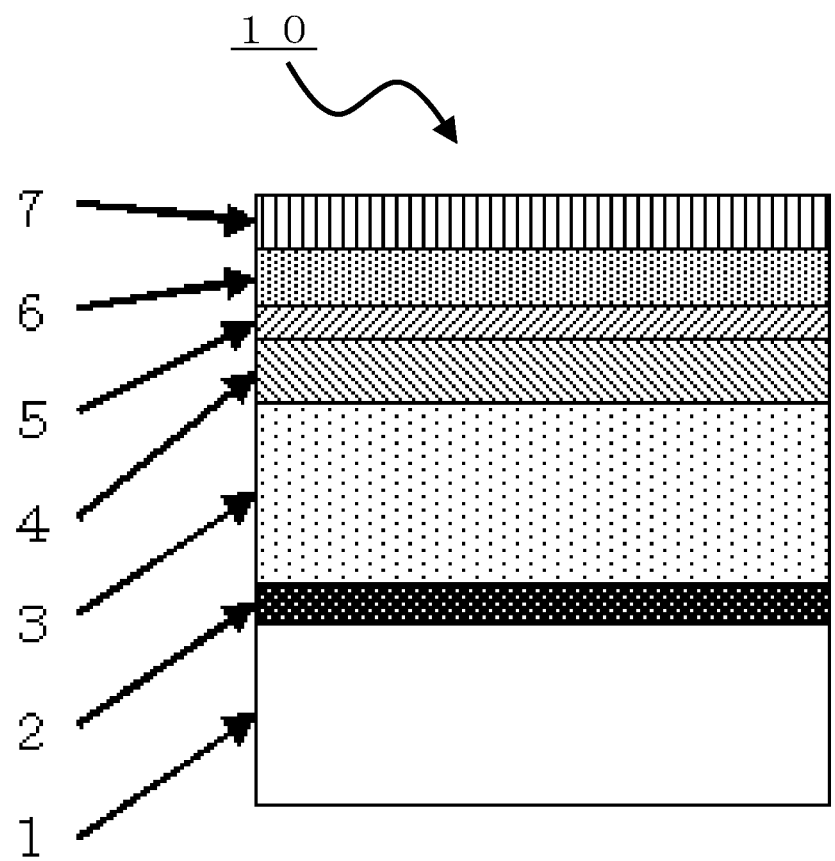
FIG. 1 is one example of a schematic diagram showing the structure of the group III nitride laminate of the present invention.

As shown in FIG. 1, the group III nitride laminate of the present invention comprises the laminate structure wherein $Al_XGa_{1-X}N$ layer ($0<X\leq1$) which is lattice matched with an AlN single crystal substrate is stacked on the AlN single crystal substrate 1, and a GaN layer 7 is stacked on said $Al_XGa_{1-X}N$ layer ($0<X\leq1$). Note that, in the figure, the embodiment comprising plurality (2 to 6) of $Al_XGa_{1-X}N$ layers is shown, however the number of layers of the $Al_XGa_{1-X}N$ layer is not limited thereto, and it may be at least 1. Hereinafter, the laminate structure is described in order.

(Group III Nitride Laminate 10)
(AlN Single Crystal Substrate 1)

In the present invention, the AlN single crystal substrate 1 which is the foundation substrate is not particularly limited, but preferably that having low dislocation density is preferably used. Specifically, the dislocation density of the AlN single crystal substrate 1 is preferably $10^6$ cm$^{-2}$ or less, and more preferably $10^4$ cm$^{-2}$ or less. By using such AlN single crystal substrate 1 with low dislocation density, the characteristic of the luminescence element can be improved, and also since the dislocation density is lower than the dislocation density in the GaN layer 7, this will not cause the increase of new dislocation density. The lower limit of the dislocation density is 0 cm$^{-2}$. Note that, in the present invention, the dislocation density including the dislocation density in other layers is the value measured by a transmission electron microscope (TEM) unless mentioned otherwise.

In the present invention, the crystal growth plane of the AlN single crystal substrate 1, that is a crystal plane where the $Al_XGa_{1-X}N$ layer ($0<X\leq1$) and the GaN layer are grown thereon is not particularly limited as long as the structure of the present invention can be attained, but preferably it is c-plane from the point of improving the smoothness of the $Al_XGa_{1-X}N$ layer. Also, the crystal growth plane may be slightly tilted (off) from c-plane, and in such case, an off angle is preferably 0.1 to 0.5°, and further it is preferably inclined towards the m-axis direction.

The crystal growth plane of the AlN single crystal substrate 1 is preferably smooth. By having a smooth plane, a new dislocation can be reduced which is generated at the single crystal layer stacked on the AlN single crystal substrate, for example at the boundary between $Al_XGa_{1-X}N$ layer ($0<X\leq1$). Specifically, the root mean roughness (RMS) at the area of $5\times5$ μm$^2$ is preferably 5 nm or less, more preferably 1 nm or less, and even more preferably 0.5 nm or less. Such smooth plane can be obtained by known Chemical Mechanical Polish (CMP) treatment.

Also, if a damage caused by CMP treatment is remained on the crystal growth plane of the AlN single crystal substrate 1, this will cause the lattice relaxation of the $Al_XGa_{1-X}N$ layer ($0<X\leq1$), and new dislocation may be generated, thus it is necessary to suppress the polishing damage as much as possible. Such polishing damage can be evaluated by measuring a pit density formed on the new surface after the etching by known alkali or acid etching treatment. A pit is formed at the dislocation and the damage remaining area in the AlN single crystal substrate, thus the density thereof is preferably small, and 5/mm$^2$ or less at the crystal growth plane of the AlN single crystal substrate is preferable, and more preferably it is 2/mm$^2$ or less. Obviously, the polishing scars or so also needs to be suppressed as much as possible, and preferably the number of the polishing scar is preferably 0/substrate.

The AlN single crystal substrate 1 preferably has high permeability with respect to the light irradiated by the luminescence element formed at the end. Therefore, the absorbance coefficient at the ultraviolet ray area, more specifically at the wavelength of 210 nm or more is preferably 25 cm$^{-1}$ or less. Note that, regarding the lower limit of the absorption coefficient, the lower it is, the more preferable it is, however considering the industrial production and measuring precision of the AlN single crystal substrate, the lower limit of the absorption coefficient at the wavelength of 210 nm or more is 15 cm$^{-1}$. By using the AlN single crystal substrate having such low absorption coefficient, it can expect to suppress the output from declining which is caused by the ultraviolet absorption in the AlN single crystal substrate, and by the heat generated when absorbing the ultraviolet ray.

The thickness and the size of the AlN single crystal substrate 1 used in the present invention are not particularly limited. The thickness of the AlN single crystal substrate is preferably thin, as this will allow lowering the absorption coefficient, however if it is too thin, then it is difficult to handle, and also it may lower the yield of the luminescence element. Therefore, usually it is preferably 50 to 1000 μm. Also, the size of the AlN single crystal substrate in case of growing the $Al_XGa_{1-X}N$ layer ($0<X\leq1$) thereon, the larger it is, the more preferable it is; since the number of the luminescence element (chip) obtained at the end can be increased. However, considering the industrial production of the luminescence element, it preferably has the diameter of φ0.5 to φ6 inch (φ1.27 to 15.24 cm). Note that, obviously, for example in case of the luminescence element (chip), the size of the AlN single crystal substrate part of said chip will become smaller, hence the size may be determined depending on the use of the luminescence element (chip). Usually, in case of the luminescence element (chip), the size of the AlN single crystal substrate part (the area of the largest plane) is the area of 0.01 to 10 mm$^2$.

The AlN single crystal substrate 1 as discussed in the above can be produced by a sublimation method or halide vapor phase epitaxy (HVPE) method as disclosed in the non-patent documents 4 and 5. Among these, when using the group III nitride laminate of the present invention to the luminescence element, the permeability at the ultraviolet range is preferably high, thus it is preferably produced by HVPE method.

($Al_XGa_{1-X}N$ Layer ($0<X\leq1$)): Latticed Matched Layer

In the present invention, the $Al_XGa_{1-X}N$ layer ($0<X\leq1$) is a single crystal layer stacked on the AlN single crystal substrate. Further, the $Al_XGa_{1-X}N$ layer ($0<X\leq1$) formed on the AlN single crystal substrate is under the condition of being lattice matched with the AlN single crystal substrate. Here, the condition being latticed matched means that the lattice constant in the parallel direction with respect to the principle plane (the plane having the largest area: the crystal growth plane of the AlN single crystal substrate) of the AlN single crystal substrate and the $Al_XGa_{1-X}N$ layer ($0<X\leq1$) are approximately the same between the AlN single crystal substrate and the $Al_XGa_{1-X}N$ layer. In other words, in the present invention, the $Al_XGa_{1-X}N$ layer ($0<X\leq1$) being lattice matched refers to the lattice relaxation rate of 5% or less. The lower limit of the lattice relaxation rate is 0%; and in this case the lattice constant of the $Al_XGa_{1-X}N$ layer and the AlN substrate are matched. Note that, this lattice relaxation rate can be calculated by measuring the lattice constant of a-axis and c-axis of the $Al_XGa_{1-X}N$ layer using X ray reciprocal lattice mapping.

In the present invention, the $Al_XGa_{1-X}N$ layer ($0<X\leq1$) may be a single layer, but in case of using for the luminescence element, it is formed by plurality of layers with different Al composition (X) and thickness. Note that, in case of forming by plurality of layers, by carrying out X ray reciprocal lattice mapping measurement, whether or not all of the layers are lattice matched with AlN single crystal substrate can be confirmed.

Also, the value of "X" is not particularly limited, and it may be determined accordingly depending on the purpose of use. Same applies in case the $Al_XGa_{1-X}N$ layer ($0<X\leq1$) is made of plurality of layers. Note that, as those which can be easily lattice matched with the AlN single crystal substrate, "X" is preferably 0.4 to 1 although this depends on the thickness of the layers.

In the present invention, the $Al_XGa_{1-X}N$ layer ($0<X\leq1$) is a single crystal layer, and it is latticed matched with the AlN single crystal substrate. That is, there is no lattice relaxation of the $Al_XGa_{1-X}N$ layer ($0<X\leq1$) which is accompanied with the dislocation, thus the dislocation density in the $Al_XGa_{1-X}N$ layer ($0<X\leq1$) is no different from the dislocation density of the surface of the AlN single crystal substrate. Therefore, the dislocation density of $Al_XGa_{1-X}N$ layer ($0<X\leq1$) is preferably $10^6$ cm$^{-2}$ or less, more preferably $10^4$ cm$^{-2}$ or less as similar to the AlN single crystal substrate. Note that, even in case the $Al_XGa_{1-X}N$ layer ($0<X\leq1$) is made of plurality of layers, these layers are all latticed matched, thus the dislocation density does not change in each layer.

The $Al_XGa_{1-X}N$ layer ($0<X\leq1$) can include n-type or p-type dopant in order to control the conductivity. Known element can be used for n-type or p-type dopant without any particular limitation, but preferably Si is used as the n-type dopant and Mg is used as the p-type dopant. The dopant concentration is not particularly limited, and it may be determined accordingly depending on the purpose. Also, the $Al_XGa_{1-X}N$ layer ($0<X\leq1$) may have a structure wherein plurality of n-type $Al_XGa_{1-X}N$ layers ($0<X\leq1$), plurality of p-type $Al_XGa_{1-X}N$ layers ($0<X\leq1$), and plurality of layers thereof are stacked. In this case, in the present invention, all of the n-type and the p-type $Al_XGa_{1-X}N$ layer ($0<X\leq1$) are lattice matched with the AlN single crystal substrate.

Also, the $Al_XGa_{1-X}N$ layer (0<X≤1) preferably has lower hydrocarbon amount. For example, if carbon is mixed in the $Al_XGa_{1-X}N$ layer (0<X≤1) a lot, there is a possibility that the conductivity and the permeability may be deteriorated, hence preferably the carbon concentration of the $Al_XGa_{1-X}N$ layer (0<X≤1) is preferably $10^{17}$ cm$^{-3}$ or less and more preferably $5 \times 10^{16}$ cm$^{-3}$ or less. In case the $Al_XGa_{1-X}N$ layer (0<X≤1) is made of plurality of layers, the carbon concentration is preferably $10^{17}$ cm$^{-3}$ or less in every layer.

Also, the thickness of the $Al_XGa_{1-X}N$ layer (0<X≤1) is not particularly limited as long as it is lattice matched with the AlN single crystal substrate, and it may be determined depending on the purpose of use. Among these, in case of using the group III nitride laminate of the present invention to the luminescence element, the thickness is preferably 0.3 to 3 μm. Note that, in case the $Al_XGa_{1-X}N$ layer (0<X≤1) is made of plurality of layers, then this thickness is the total thickness of each layers. In case it is plurality of layers, the thickness of each layer may be determined depending on the purpose of use, and it may be the same thickness or different thickness.

In the present invention, the $Al_XGa_{1-X}N$ layer (0<X≤1) is preferably smooth. In this case, the outer most plane of the $Al_XGa_{1-X}N$ layer (0<X≤1) wherein the GaN layer is directly stacked is smooth. Therefore, in case the $Al_XGa_{1-X}N$ layer (0<X≤1) is made of plurality of layers, the surface of layer at the upper most part where the GaN layer is stacked is preferably smooth. By having smooth $Al_XGa_{1-X}N$ layer (0<X≤1), the dislocation density in the GaN layer which will be discussed in below can be lowered. Specifically, the root mean roughness (RMS) in the area of 5×5 μm$^2$ is preferably 10 nm or less, more preferably 5 nm or less, and even more preferably 1 nm or less.

Also, the outer most plane of the $Al_XGa_{1-X}N$ layer (0<X≤1) (in case the $Al_XGa_{1-X}N$ layer (0<X≤1) is made of plurality of layers, the surface of the layer at the upper most part where the GaN layer is stacked) may be formed with a hillock having several μm of a size. Such hillock causes to increase the surface roughness of the GaN layer formed on the $Al_XGa_{1-X}N$ layer (0<X ≤1). That is, in case the hillock is formed to the outer most plane of the $Al_XGa_{1-X}N$ layer (0<X≤1), a hillock may be easily formed to the same place on the GaN layer, thus the surface roughness of the GaN layer increases, and also the thickness of the GaN layer may vary and the relaxation rate of the GaN layer tends to increase. Therefore, the hillock density at the outer most plane of the $Al_XGa_{1-X}N$ layer (0<X≤1) is preferably 10/mm$^2$ or less, more preferably 5/mm$^2$, and even more preferably 1/mm$^2$ or less. These hillocks can be controlled by the method of growing the $Al_XGa_{1-X}N$ layer (0<X≤1). Note that, in the present invention, the hillock density can be measured by a surface observation using Nomarski microscope.

(Method of Growing the $Al_XGa_{1-X}N$ Layer (0<X≤1))

Such $Al_XGa_{1-X}N$ layer (0<X≤1) can be produced on the AlN single crystal substrate by known crystal growth method using vapor phase deposition method such as MOCVD method and MBE method or so. Among these, widely used MOCVD method having high industrial productivity is preferable. For example, the $Al_XGa_{1-X}N$ layer (0<X≤1) made by MOCVD method can be produced by the condition described in WO2012/056928.

As the group III source material gas, group V source material gas and dopant source material gas used in MOCVD method, the known source materials which can be used for forming $Al_XGa_{1-X}N$ layer (0<X≤1) can be used without any particular limitation.

For example, as the group III source material gas, gas such as trimethyl aluminum, triethyl aluminum, trimethyl gallium and triethyl gallium or so are preferably used. Also, as the group V source material gas, ammonia is preferably used.

In case the $Al_XGa_{1-X}N$ layer (0<X≤1) is n-type or p-type, the dopant source material gas may be supplied simultaneously with said group III source material gas, and said group V source material gas. In case of the n-type layer, as the dopant source material gas, silane based gas such as mono silane and tetraethyl silane or so is preferably used. In case of the p-type layer, Mg source material gas of biscyclopentadienyl magnesium is preferably used.

The source material gas mentioned in above is supplied to the reactor together with the carrier gas such as hydrogen and/or nitrogen, thereby the $Al_XGa_{1-X}N$ layer (0<X≤1) is grown on AlN single crystal substrate. The preferable range of mol ratio (V/III ratio) between the group V source material gas and the group III source material gas is not particularly limited, but preferably it is within the range of 500 to 10000. V/III ratio may be determined accordingly within the above mentioned range. Note that, the group V source material gas does not include nitrogen gas.

Also, the growing temperature and growing pressure of $Al_XGa_{1-X}N$ layer (0<X≤1) are not particularly limited, but preferably it is 1000 to 1300° C. and 30 to 1000 mbar respectively, more preferably 1050 to 1200° C. and 30 to 500 mbar respectively.

Note that, in case $Al_XGa_{1-X}N$ layer (0<X≤1) is made of plurality of layers, then the ratio of the supplied group III source material gas, for example the supplying ratio of trimethyl aluminum, and trimethyl gallium is changed, thereby the $Al_XGa_{1-X}N$ layer (0<X≤1) can be formed in plurality of layers (the plurality of layers having different value of Al composition (X)).

Hereinabove, the $Al_XGa_{1-X}N$ layer (0<X≤1) stacked on the AlN single crystal layer is discussed, and as mentioned in above, in case of producing a luminescence element, the $Al_XGa_{1-X}N$ layer (0<X≤1) is made of plurality of layers. Next, the preferable example will be discussed.

(Preferable Example in Case of Making the $Al_XGa_{1-X}N$ layer (0<X≤1) by Plurality of Layers)

In the present invention, in order to widen the use of the group III nitride laminate, the $Al_XGa_{1-X}N$ layer (0<X≤1) which is stacked on the AlN single crystal substrate, and the GaN layer is stacked thereon is preferably made of plurality of layers. That is, for the laminate structure wherein the $Al_XGa_{1-X}N$ layer (0<X≤1) lattice matched with the AlN single crystal substrate stacked on the AlN single crystal substrate, the $Al_XGa_{1-X}N$ layer (0<X≤1) is preferably made of plurality of layers. In this case, as mentioned in above, all of plurality of layers must be lattice matched with the AlN single crystal substrate. Further, in order to lattice match the AlN single crystal substrate and the $Al_XGa_{1-X}N$ layer (0<X≤1), and to stack thereon the GaN layer having good crystallinity, the composition of the $Al_XGa_{1-X}N$ layer (0<X≤1) stacked on the AlN single crystal substrate at a relatively initial stage, and the production method of layer thereof are important. Specifically, in case said $Al_XGa_{1-X}N$ layer (0<X≤1) is made of plurality of layers, and the layer directly stacked with the GaN layer among these plurality of layers is defined as the $Al_ZGa_{1-Z}N$ layer (0<Z≤1), said laminate structure preferably comprises the $Al_YGa_{1-Y}N$ layer (0.7≤Y≤1) between the AlN single crystal substrate and said $Al_ZGa_{1-Z}N$ layer (0<Z≤1). Further, as described in below, this $Al_YGa_{1-Y}N$ layer (0.7≤Y≤1) is preferably stacked directly on the AlN single crystal substrate.

Also, in the present invention, besides having the above mentioned laminate structure, from the point of performance, particularly in case of using the group III nitride laminate for the luminescence element and laser element or so, the $Al_XGa_{1-X}N$ layer (0<X≤1) preferably has plurality of layers stacked in the order of the n-type layer, active layer, and p-type layer from the AlN single crystal substrate side. Further, the single crystal buffer layer may be formed between the AlN single crystal layer and the n-type layer. Also, an electron block layer having relatively high Al composition ratio may be formed between the active layer and the p-type layer. This electron block layer may be the p-type layer.

The above mentioned n-type layer, active layer and p-type layer may be a single layer; but these respectively may be plurality of layers, for example the layers may have different Al composition and different dopant concentration or so.

Note that, as mentioned in above, the n-type layer 3, the active layer 4, the p-type layer 6, and the single crystal buffer layer 2 and the electron block layer 5 which are stacked if needed, all satisfy the composition of the $Al_XGa_{1-X}N$ layer (0<X≤1), further these are lattice matched with the AlN single crystal substrate.

(Single Crystal Buffer Layer 2)

This single crystal buffer layer 2 is directly stacked on the AlN single crystal substrate 1. As it will be discussed in below, in case the Al composition in the n-type layer 3 is high, although the single crystal buffer layer 2 is not necessarily needed, by providing the single crystal buffer layer 2, the smoothness of the $Al_XGa_{1-X}N$ layer (0<X ≤1) where the GaN layer 7 is directly stacked can be improved, and the hillock density can be reduced. Therefore, this single crystal buffer layer 2 is preferably a layer having a high Al composition. Specifically, this single crystal buffer layer 2 is preferably said $Al_YGa_{1-Y}N$ layer (0.7≤Y≤1). In case of providing such single crystal buffer layer 2, the thickness thereof is preferably 0.01 to 1 µm. Further, this single crystal buffer layer 2 is preferably grown by the method described as the method of growing the $Al_XGa_{1-X}N$ layer (0<X≤1) using MOCVD method, wherein the V/III ratio is 4000 to 10000, and more preferably 4500 to 8000. Note that, for other growing condition, the range described in the method of growing the $Al_XGa_{1-X}N$ layer (0<X≤1) may be employed. By providing the $Al_YGa_{1-Y}N$ layer (0.7≤Y≤1) grown under such condition as the single crystal buffer layer, the crystal defect around the boundary between the AlN single crystal substrate and the $Al_XGa_{1-X}N$ layer (0<X≤1) is effectively suppressed from being generated. As a result, the smoothness of the $Al_ZGa_{1-Z}N$ layer (0<Z≤1) where the GaN layer is stacked improves, hence the hillock density tends to further decrease. Also, the GaN layer having even better crystallinity can be formed.

(N-type Layer 3)

This n-type layer 3 is not particularly limited, as long as it is the $Al_XGa_{1-X}N$ layer (0<X≤1) lattice matched with the AlN single crystal substrate 1, and the composition thereof may be determined in accordance with the luminescence element as a goal. Among these, in case the group III nitride laminate 10 of the present invention is used for the ultraviolet ray emitting element having the luminescence peak wavelength at 210 to 350 nm, the n-type layer 3 needs to select the Al composition ratio so that the $Al_XGa_{1-X}N$ layer is transparent with respect to the luminescence peak wavelength. In order to make this $Al_XGa_{1-X}N$ layer (0<X≤1) to the n-type layer, as discussed in above, the silane based dopant source material may be supplied when growing by MOCVD method. The concentration of Si for doping is not particularly limited, but in order to obtain high n-type conductivity, it is preferably within the range of $5 \times 10^{18}$ to $3 \times 10^{19}$ cm$^{-3}$. Note that, the n-type layer 3 may be directly provided on the AlN single crystal substrate 1 without providing the single crystal buffer layer 2. In this case, the n-type layer is preferably said $Al_YGa_{1-Y}N$ layer layer (0.7'Y<1).

The thickness of such n-type layer 3 is not particularly limited, but it is 500 nm to 1500 nm.

(Active Layer 4)

This active layer 4 is stacked on said n-type layer 3. This active layer 3 is not particularly limited as long as it is the $Al_XGa_{1-X}N$ layer (0<X≤1) lattice matched with the AlN single crystal substrate 1, and known layer can be used. Specifically, it may be a multiple quantum well layer wherein a quantum well layer and barrier layer are stacked plurality of times. This multiple quantum well layer can be doped with Si. The composition of the quantum well layer and the barrier layer may be determined accordingly depending on the purpose of use. Particularly, in the $Al_XGa_{1-X}N$ layer, "X" is preferably regulated within the range of 0.1 to 0.8; and from the point of lattice match, it is even more preferable to regulate within the range of 0.4 to 0.8.

Also, the thickness of the quantum well layer and the barrier layer are not particularly limited, and usually one quantum well layer has a thickness of 2 to 10 nm, and one barrier layer has the thickness of 5 to 25 nm.

Such active layer 4 may be grown to satisfy a desired composition and layer constitution using the condition of the method described in the method of growing the $Al_XGa_{1-X}N$ layer (0<X ≤1).

(Electron Block Layer 5)

This electron block layer 5 is stacked on the active layer 4. Note that, this electron block layer 5 can be a p-type, thus this may be considered as one of the p-type layer 6. This electron block layer 5 is desired to have high band gap energy, thus the Al composition preferably has higher ratio than other layer. Therefore, in case of producing the luminescence element particularly having the luminescence peak wavelength shorter than 280 nm, the $Al_XGa_{1-X}N$ layer (X=1) is most preferable. Also, in case the luminescence peak wavelength is longer than 280 nm, then Al composition is determined accordingly within the range of the $Al_XGa_{1-X}N$ layer (0.3≤X≤1). The thickness of this electron block layer is not particularly limited, but preferably it is 5 to 50 nm.

Such electron block layer 5 may be grown to satisfy the desired composition by employing the condition of method described in the method of growing the $Al_XGa_{1-X}N$ layer (0<X≤1). Further, in case of forming the p-type, it may be grown by supplying the Mg source material gas. The Mg concentration is not particularly limited, and preferably the Mg concentration is $3 \times 10^{19}$ to $2 \times 10^{20}$ cm$^{-3}$, and more preferably $5 \times 10^{19}$ to $1 \times 10^{20}$ cm$^{-3}$.

(P-type Layer 6)

This p-type layer 6 is formed on said electron block layer 5. The p-type layer 6 can be formed from plurality of layers, but in such case, if Al composition is higher than other layers, this allows having similar function as the electron block layer, thus it may be stacked on the active layer. The composition of the p-type layer may be determined in accordance with the purpose of use. In case of producing the luminescence element particularly having the luminescence peak wavelength shorter than 280 nm, "X" is preferably regulated within the range of 0.7 to 1.0 in the $Al_XGa_{1-X}N$ layer. The thickness of the p-type layer is not particularly limited, and usually it is 5 to 100 nm or so.

The upper most layer of the p-type layer 6 is the layer where the GaN layer 7 is directly stacked, thus the composition thereof is $Al_ZGa_{1-Z}N$ layer ($0<Z\leq1$), and the composition may be determined in accordance with the purpose of use. As discussed in above, this $Al_ZGa_{1-Z}N$ layer ($0<Z\leq1$) preferably has the root mean roughness (RMS) of 10 nm or less, more preferably 5 nm or less, and even more preferably 1 nm or less at the area of $5\times5$ $\mu m^2$ on the surface where the GaN layer 7 is to be stacked. Also, the hillock density is preferably $10/mm^2$ or less, more preferably $5/mm^2$ or less, and even more preferably $1/mm^2$ or less. Such $Al_ZGa_{1-Z}N$ layer ($0<Z\leq1$) can be grown by employing the condition of method described in the method of growing the $Al_XGa_{1-X}N$ layer ($0<X\leq1$). Particularly, the growing condition similar to the above mentioned single crystal buffer layer 2 and n-type layer 3 is employed.

The p-type layer itself may be grown to satisfy the desired composition and layer structure by employing the condition of method described in the method of growing the $Al_XGa_{1-X}N$ layer ($0<X\leq1$).

Hereinabove, the preferable example in case the $Al_XGa_{1-X}N$ layer ($0<X\leq1$) is a plurality of layers has been discussed, but the present invention is not to be limited to the above constitution. Also, in the above example, the total thickness of the plurality of layers is preferably within the range of 0.3 to 3 μm. Further, for other preferable example, the lattice relaxation rate, the dislocation density and the carbon concentration or so are preferably the same as discussed in the $Al_XGa_{1-X}N$ layer ($0<X\leq1$).

(GaN Layer 7)

In the present invention, the GaN layer 7 is a single crystal layer, and is formed on the $Al_XGa_{1-X}N$ layer (in case of plurality of layers, then on the $Al_ZGa_{1-Z}N$ layer) which is lattice matched with the AlN single crystal substrate 1. Therefore, the GaN layer is compression strained due to the lattice constant difference with the $Al_XGa_{1-X}N$ layer, and as the thickness increases, the amount of compression strain accumulated in the GaN layer increases. As the amount of the compression strain increases, the strain is relieved as new dislocation is formed in the GaN layer, as a result, the dislocation density in the GaN layer increases, and also the full width at half maximum of X ray omega rocking curve also increases. Therefore, the GaN layer thickness needs to be 5 to 400 nm.

The GaN layer 7 absorbs the light having shorter wavelength than 365 nm, thus in case of using the group III nitride laminate of the present invention for the ultraviolet ray emitting element, from the point of reducing the light absorption amount at the GaN layer and to improve the luminescence efficiency, the GaN layer is preferably thin. In order to suppress the increase of the dislocation density and the full width at half maximum of X ray omega rocking curve, and to reduce the light absorption amount at the GaN layer, the thickness of the GaN layer is 5 to 150 nm, more preferably 5 to 100 nm, and even more preferably 5 to 50 nm.

On the other hand, if the GaN layer becomes thick, the current density distribution in the GaN layer becomes even more uniform, thus the deterioration between the GaN layer and the electrode boundary can be suppressed when driving the ultraviolet ray emitting element, and as a result, the increasing rate of the driving voltage can be reduced. In order to suppress the dislocation density and the full width at half maximum of X ray omega rocking curve from increasing, and to reduce the voltage increasing rate, the thickness of the GaN layer is preferably 150 to 400 nm, more preferably 250 to 400 nm. However, if the thickness of the GaN layer is 400 nm or more, then the strain relaxation as discussed in above will proceed, and as a result, the dislocation density may increase, and the surface smoothness may deteriorate.

In one embodiment of the present invention, the dislocation density of the GaN layer 7 is less than $5\times10^{10}$ $cm^{-2}$. In case the group III nitride laminate of the present invention is the luminescence element, then from the point of improving the reliability thereof, the dislocation density in the GaN layer which can cause the leak pass of current may be less than $1\times10^{10}$ $cm^{-2}$ for certain embodiment, and for other embodiment it may be less than $5\times10^9$ $cm^{-2}$. The dislocation density of the GaN layer can be lowered for example by slowing the growth rate of GaN layer to suppress the relaxation in the GaN layer. Note that, the dislocation density in such case is the dislocation density at the outer most plane of the GaN layer. The lower limit of the dislocation density is preferably 0, but considering the growth mechanism of the GaN layer, it is difficult to avoid the dislocation accompanying the strain relaxation at the initial stage of the GaN layer growth, thus as the production technology at this point, the lower limit is $10^6$ $cm^{-2}$ or so.

In other embodiment of the present invention, the full width at half maximum of X ray omega rocking curve of (002) plane and (102) plane of the GaN layer is 50 to 300 seconds. Here, the rocking curve measurement is a diffraction obtained by fixing the detector at a position of two times of the angle where a particular crystal plane satisfies a bragg diffraction condition. The dislocation density in the crystalline can be evaluated by the full width at half maximum of the rocking curve, and the smaller the value of the full width at half maximum is, the lower the dislocation density in the GaN single crystal layer is. Also, for the group III nitrides, the crystal plane for the rocking curve measurement is carried out to (002), (100), and (102) plane. The full width at half maximum of (002) and (100) plane respectively show the value reflecting the degree of a spiral dislocation density and an edge-form dislocation density. Also, for that of (102) plane, it shows the value reflecting the condition combining dislocation defect density of the above mentioned two types. The GaN layer of the present invention has lower dislocation density than that of conventional ones, thus the full width at half maximum of the rocking curve can be reduced along with that, but at (002) plane, 50 to 200 seconds is preferable, and 50 to 150 seconds is more preferable. Also, at (102) plane, 50 to 260 seconds is preferable, and 50 to 230 seconds is more preferable.

Note that, the GaN layer 7 of the present invention has the dislocation density of less than $5\times10^{10}$ $cm^{-2}$, or the full width at half maximum of X ray omega rocking curve of (002) plane and (102) plane are 50 to 300 seconds, but obviously both the dislocation density and the full width at half maximum of X ray omega rocking curve are most preferably within the above mentioned range.

Also, as mentioned in above, the GaN layer has a large lattice constant between the $Al_XGa_{1-X}N$ layer ($0<X\leq1$) which is the foundation, thus the GaN layer is known to grow by a three dimensional growth mode of SK or VW type. In such growth model, at the initial stage of three dimensional growth, the dislocation is formed in the GaN layer along with the lattice relaxation. Therefore, the dislocation density in the GaN layer is influenced by the dislocation density of the $Al_XGa_{1-X}N$ layer ($0<X\leq1$) which is the foundation, and also by the dislocation generated along with the lattice relaxation at the initial stage of the GaN layer growth. Therefore, in order to reduce the dislocation density in the GaN layer, in addition of lowering the dislocation density of the $Al_XGa_{1-X}N$ layer ($0<X\le1$), preferably the GaN layer is grown while suppressing the relaxation rate. In the present invention, the lattice relaxation rate of the GaN layer is less than 75%, and preferably 70% or less, and more preferably 65% or less. The lower limit of the relaxation rate is ideally 0%, but considering the relaxation during the three dimensional growth, the lower limit is thought to be about 30% or so.

The surface condition of the GaN layer 7 is preferably smooth from the point of improving the reliability of the element; and preferably the root mean roughness (RMS) at the area of $5\times5$ μm$^2$ is 10 nm or less, preferably 5 nm or less, and more preferably 3 nm or less. Also, the GaN layer on the $Al_XGa_{1-X}N$ layer ($0<X\le1$) is formed with the hillock made of the GaN crystalline of island form having a size of several to several tens μm as discussed in the non-patent document 3. Such a large hillock may cause a reliability to decline. Therefore, the hillock density of the GaN layer surface is 20/mm$^2$ or less, preferably 10/mm$^2$, and more preferably 5/mm$^2$ or less.

In case of applying the group III nitride laminate of the present invention to the ultraviolet ray emitting element, the GaN layer is preferably the p-type GaN layer wherein Mg is doped. Hereinafter, the characteristic of the p-type GaN layer doped with Mg will be described in detail.

The average Mg concentration in the p-type GaN layer is preferably $1\times10^{17}$ cm$^{-3}$ to $2\times10^{20}$ cm$^{-3}$. The Mg concentration is not particularly limited as long as it is within the range of the present invention; and it may be uniform concentration in the GaN layer, or it may be different in the thickness direction. Note that, the above mentioned average Mg concentration may be determined based on the thickness of the p-type GaN layer, but the Mg concentration near the boundary and the Mg concentration near the surface are excluded. In case of obtaining higher p-type conductivity, the average Mg concentration is preferably $1\times10^{19}$ to $2\times10^{20}$ cm$^{-3}$, and more preferably $5\times10^{19}$ to $1\times10^{20}$ cm$^{-3}$.

In the present invention, the Mg concentration profile near the boundary between the p-type GaN layer and where the p-type GaN layer is directly stacked is preferably at a peak. In case the GaN layer of the present invention is the p-type layer, there is a part where the Mg concentration is high near the p-type GaN layer and said $Al_XGa_{1-X}N$ ($Al_ZGa_{1-Z}N$) layer (see FIG. 2). In case a constant amount of Mg source material is introduced simultaneously with the start of the GaN layer growth, then this Mg concentration peak at the boundary will show the Mg concentration distribution having the above peak. The mechanism of such phenomena is not quite clear, but the present inventors speculate that this is caused by high crystallinity of the GaN layer (the dislocation density of less than $5\times10^{10}$ cm$^{-2}$, and the full width at half maximum of X ray omega rocking curve of (002) plane and (102) plane are 50 to 300 seconds). That is, when compared to those with a large dislocation density, and having 100% of relaxation rate of the GaN layer, the GaN layer of the present invention has larger strain at the boundary, and thus the Mg intake amount is thought to be increased. The peak value of the Mg concentration at the boundary may change depending on the Mg concentration in the GaN layer, but by in large, it is 1.5 to 3.0 times or so of the average Mg concentration in the GaN layer. Note that, this Mg concentration profile in the GaN layer can be measured by known technology such as Secondary Ion Mass Spectrometry (SIMS) or so.

(Method of Growing the GaN Layer 7)

The GaN layer 7 can be produced by a known crystal growth method using a vapor phase deposition method such as MOCVD method and MBE method; but as similar to $Al_XGa_{1-X}N$ layer, MOCVD method is preferably used. As the group III source material gas, group V source material gas and dopant source material gas used for the MOCVD method, known source materials can be used without particular limitation; but as the group III source material gas, trimethyl gallium, triethyl gallium are preferably used. Also, as the group V source material gas, ammonia is preferably used. Also, as the dopant gas, Si source material and Mg source material gas same as the $Al_XGa_{1-X}N$ layer can be used. The V/III ratio during the GaN layer growth is preferably set within the range of 2000 to 15000, more preferably within 4000 to 12000, and most preferably within 6000 to 10000.

Also, as the carrier gas used for growing the GaN layer, the mixed gas of hydrogen gas and nitrogen gas is preferably used. Along with the increase of the nitrogen gas in the mixed gas, the smoothness tends to improve. This is because the density of the three dimensional initial growth core of the GaN layer formed on the $Al_XGa_{1-X}N$ layer increases along with the mixing of nitrogen. However, if the density of the three dimensional growth core becomes too much as the nitrogen gas mixing ratio increases, this will promote the lattice relaxation of the GaN layer, as a result, the dislocation density of the GaN layer tends to increase. Also, as mentioned in above, generally, the smoothness of the GaN layer tends to improve by mixing the nitrogen gas, but the surface smoothness may deteriorate along with the increase of the dislocation density in some case.

Further, the mixing ratio of nitrogen gas influences the conductivity of the GaN layer as well. If the mixing ratio of the nitrogen gas in the carrier gas exceeds 0.6, the conductivity of the p-type GaN layer decreases, and also the contact resistance between the p-type GaN layer and the electrode formed on the p-type GaN layer tends to increase. Therefore, the mixing ratio of the nitrogen gas is preferably 0 or more and 0.6 or less, and more preferably 0.1 or more and 0.5 or less. Further, the embodiment of the preferable carrier gas is the mixed gas of hydrogen gas and nitrogen gas, thus the volume ratio (the volume flow ratio) of both preferably satisfy the nitrogen gas of 0.1 or more and 0.5 or less, and hydrogen gas of 0.5 or more and 0.9 or less; more preferably the nitrogen gas of 0.1 or more and less than 0.5, and hydrogen gas of more than 0.5 and 0.9 or less; and further preferably nitrogen gas of 0.3 or more and 0.4 or less, and hydrogen gas of 0.6 or more and 0.7 or less. In this case, the carrier gas is made of hydrogen gas and nitrogen gas, and the total volume (the total volume flow amount) of hydrogen gas and nitrogen gas is 1. Also, this volume ratio (the volume flow ratio) is the value obtained from the volume flow amount at a standard condition (1 atm) of the carrier gas supplied to the reactor.

The growing temperature of GaN layer is 1000 to 1100° C., and more preferably 1020 to 1080° C., thereby it is produced. During the growth of the GaN layer, the growth and decomposition (evaporation) of the GaN occurs concurrently in the above temperature range, and in case the group III source material gas amount is constant, the growth rate decreases due to the heat decomposition along with the increase of the growth temperature. The ratio of growth and decomposition of the GaN layer can be controlled by a growth parameter such as the growth temperature, group III source material gas amount, and group V source material gas amount or so. In case of producing the GaN layer of the present invention, in addition to the GaN layer growth rate, preferably the ratio between the growth and decomposition is controlled within the preferable range. That is, the growth rate of the GaN layer is preferably 0.03 to 0.35 μm/h, and more preferably 0.05 to 0.1 μm/h. Also, this growth rate is 0.1 to 0.8 times and more preferably 0.3 to 0.6 times more with respect to the growth rate not influenced by the decomposition. Note that, the growth rate not influenced by the decomposition can be estimated by the growth rate at less than 1000° C. of growing temperature which is the temperature range where the influence of the decomposition can be ignored.

(One Example of the Group III Nitride Laminate)

Next, the case of producing the luminescence element made of the group III nitride laminate of the present invention will be described using the luminescence diode having the luminescence peak wavelength of 260 nm as an example. The n-type $Al_{0.75}Ga_{0.25}N$ layer is grown within the thickness of 500 nm to 1500 nm on the AlN single crystal substrate by MOCVD method. The multiple quantum well layer made of 7 nm of the n-type $Al_{0.7}Ga_{0.3}N$ layer and 3 nm of the n-type $Al_{0.5}Ga_{0.5}N$ layer, on the n-type $Al_{0.75}Ga_{0.25}N$ layer. Si may be doped in the multiple quantum well layer. Next, the p-type AlN layer, the p-type $Al_{0.8}Ga_{0.2}N$ layer are stacked in this order. The thickness of the p-type AlN layer and the p-type $Al_{0.8}Ga_{0.2}N$ layer are not particularly limited, but the thickness are 5 to 20 nm, 5 to 100 nm or so respectively. Hereinabove, the n-type $Al_{0.75}Ga_{0.25}N$ layer, the multiple quantum well layer (active layer), the p-type AlN layer and the p-type $Al_{0.8}Ga_{0.2}N$ layer correspond to the $Al_XGa_{1-X}N$ layer (0<X≤1) which is lattice matched with the AlN single crystal substrate.

Then, the p-type GaN layer is grown on the p-type $Al_{0.8}Ga_{0.2}N$ layer under the growing condition discussed in above. The group III nitride epitaxial wafer grown as such is subjected to a known photolithography, dry etching and vacuum evaporation method, thereby luminescence diode wafer is produced. Then, the luminescence diode wafer is diced by a known chip cutting technology; thereby the luminescence diode chip is obtained. The size of the luminescence diode chip is not particularly limited, but usually it is a square chip wherein one side is about 300 to 2000 μm or so. In the above, the case wherein the luminescence peak wavelength is 260 nm has been discussed, but if the luminescence peak wavelength is changed, Al composition (X) and the thickness of the $Al_XGa_{1-X}N$ layer may be selected in accordance with the desired wavelength. Also, using MOCVD method, the above mentioned group III nitride laminate can be produced after growing the $Al_YGa_{1-Y}N$ layer (0.7≤y≤1) (single crystal buffer layer) on the AlN single crystal substrate. Note that, in the present invention, the luminescence element does not only refer to the chip after the dicing, but also includes the wafer shape prior to the dicing as well.

The luminescence element chip produced is flip chip mounted to the sub-mount which uses crystalline material such as ceramic of AlN and $Al_2O_3$ or so and Si, SiC or so as the base material. In this structure, the ultraviolet ray is taken outside via the substrate. Then, if needed, it is packaged to ceramic package and CAN package, thereby the ultraviolet diode lamp is made.

EXAMPLE

Hereinafter, the present invention is described in detail using the example wherein the present invention is applied to the luminescence diode having the luminescence peak wavelength of 260 nm, but the present invention is not to be limited thereto. For example, in case of producing the ultraviolet ray emitting element, the luminescence peak wavelength of the element is not limited to 260 nm, and it may be selected accordingly within the range of 210 to 350 nm. The luminescence peak wavelength can be controlled by appropriately selecting the composition and thickness of the active layer and the dopant concentration or so.

Example 1

(Preparation of the AlN Single Crystal Substrate 1)

The AlN single crystal substrate 1 was produced by the method described in Applied Physics Express 5 (2012) 122101. Specifically, first the c-plane AlN seed substrate having ϕ25 mm was prepared which was produced by PVT method. This AlN seed substrate has an off angle of 0.05 to 0.5°, and the dislocation density is $10^4$ cm$^{-2}$ or less. Also, using the high resolution X ray diffractometer (X 'Pert made by SPECTRIS company PANAlytical B. V.), X ray rocking curve measurement was carried out to (002) plane and (102) plane under the condition of the accelerated voltage of 45 kV, and the accelerated current of 40 mA, both the full width at half maximum of X ray rocking curve were 30 second or less.

Next, on said AlN seed substrate, the AlN thick film having the thickness of 300 μm was formed by HVPE method (hereinafter, this will be referred as a HVPE method AlN thick film), then a chemical mechanical polishing (CMP) was carried out to the AlN thick film growth plane. The full width at half maximum of X ray rocking curve measurement of the HVPE method AlN thick film after CMP was also 30 seconds or less; and the dislocation density of the HVPE method AlN thick film was also confirmed that the crystalline quality of $10^4$ cm$^{-2}$ or less was maintained as similar to the AlN seed substrate.

Also, the off angle of the HVPE method AlN thick film after CMP was controlled within 0.2 to 0.5°. The root mean roughness (RMS) of the crystal growth plane (the polished plane of the HVPE method AlN thick film) of the growth substrate (the substrate wherein the HVPE method AlN thick film is stacked on the AlN seed substrate) produced as such was 0.1 nm or less within the range of 5×5 μm$^2$. The etch pit density was 0/mm$^2$ which was verified using Nomarski microscope after immersing in the acid mixture solution (sulfuric acid: phosphoric acid=1:3) for 10 min at 190° C.

Further, as result of the measurement of the permeability measurement of the HVPE method AlN thick film similarly produced had a linear permeability of 40% or more in the range of 210 to 350 nm; and the absorbance coefficient in said wavelength range was confirmed to be 25 cm$^{-1}$ or less. Note that, as described in below, when producing the ultraviolet ray emitting element, the AlN seed substrate part is removed from this growth substrate at the end. Therefore, the HVPE method AlN thick film part corresponds to the AlN single crystal substrate 1 of the present invention.

The luminescence element having the structure shown in FIG. 1 was produced using the growth substrate which was produced as discussed in above (note that, the electrode part is not shown in the figure).

(Single Crystal Buffer Layer 2)

First, the growth substrate was set on the succeptor in the MOCVD device, and while flowing the mixed gas of hydrogen and nitrogen having the total flow amount of 13 slm, it was heated to 1200° C., then the crystal growth plane was cleaned. Next, the substrate temperature was set to 1180° C., the source material gas flow amount was regulated so that the trimethyl aluminum flow amount was 8.8 μmol/min, and the ammonia flow amount was set to 1 slm, and the V/III ratio at this time was 5100. Then, AlN homoepitaxial layer 2 (the single crystal buffer layer 2) having the thickness of 0.05 μm was formed under the condition of the entire flow amount of 10 slm, and the pressure of 40 mbar.

(N-type Layer 3)

Next, the substrate temperature was set to 1050° C., and under the condition of trimethyl aluminum flow amount of 35 μmol/min, trimethyl gallium flow amount of 18 μmol/min, tetraethyl silane flow amount of 0.02 μmol/min, and ammonia flow amount of 1.5 slm; thereby 1.0 μm of the n-type $Al_{0.7}Ga_{0.3}N$ layer 3 (the n-type layer 3) was formed. The n-type $Al_{0.7}Ga_{0.3}N$ layer 3 after the growth had RMS of 5×5 μm² of 2 nm, and the hillock density measured by Nomarski microscope was 1/mm² or less.

(Active Layer 4)

Next, the barrier layer having the thickness of 10 nm was formed under the same condition as the n-type $Al_{0.7}Ga_{0.3}N$ layer except that the tetraethyl silane flow amount was set to 0.002 μmol/min. Next, the $Al_{0.5}Ga_{0.5}N$ well layer having the thickness of 4 nm was formed under the same condition as the n-type $Al_{0.7}Ga_{0.3}N$ layer except that the trimethyl gallium flow amount was set to 40 μmol/min, and the trimethyl aluminum was set to 3 μmol/min. This growth of the well layer and the barrier layer were repeated for 3 times, thereby a triple quantum well layer 4 (the active layer 4) was formed.

(P-type Layer: the Electron Block Layer 5 of the p-type)

Next, the p-type AlN layer 5 (the electron block layer 5, or the p-type layer) having the thickness of 20 nm was formed under the same condition as the n-type $Al_{0.7}Ga_{0.3}N$ layer except that trimethyl gallium and tetraethyl silnae were not supplied, and 1.0 μmol/min of biscyclopentadienyl magnesium was supplied.

(P-type: the Layer 6 Where the GaN Layer is Stacked)

Next, the p-type $Al_{0.8}Ga_{0.2}N$ layer 6 (the p-type layer 6: $Al_ZGa_{1-Z}N$ layer) having the thickness of 30 nm was formed under the same condition as the p-type AlN layer except that trimethyl gallium flow amount of 8 μmol/min was supplied.

Also, besides the production of the luminescence diode, the same procedure was carried out until producing the p-type $Al_{0.8}Ga_{0.2}N$ layer, and the surface of the p-type $Al_{0.8}Ga_{0.2}N$ layer was observed. As a result of observation using Nomarski microscope, the hillock density was 1/mm². Also, RMS of 5×5 μm² range was 2.1 nm.

(P-type GaN Layer 7)

Next, the substrate temperature was changed to 1030° C., and the pressure was changed to 200 mbar, then under the condition of trimethyl gallium flow amount of 0.2 μmol/min, ammonia flow amount of 3.0 slm, biscyclopentadienyl magnesium flow amount of 1.0 μmol/min, and carrier gas flow amount of 7 slm (the mixture ratio (the flow amount ratio) of nitrogen gas: hydrogen gas=0.4:0.6); thereby the p-type GaN layer 7 having the thickness of 30 nm was formed. Here, the growth rate of the p-type GaN layer was 0.075 μm/h, which is 0.46 times with respect to the growth rate of the GaN layer under the same condition at 980° C.

The group III nitride laminate 10 produced as such was taken out of MOCVD device. The surface of the p-type GaN layer of the laminate taken out had RMS of 2 nm, and the hillock density measured by Nomarski microscope was 2/mm².

(Evaluation of the Group III Nitride Laminate 10)

Figure 2:
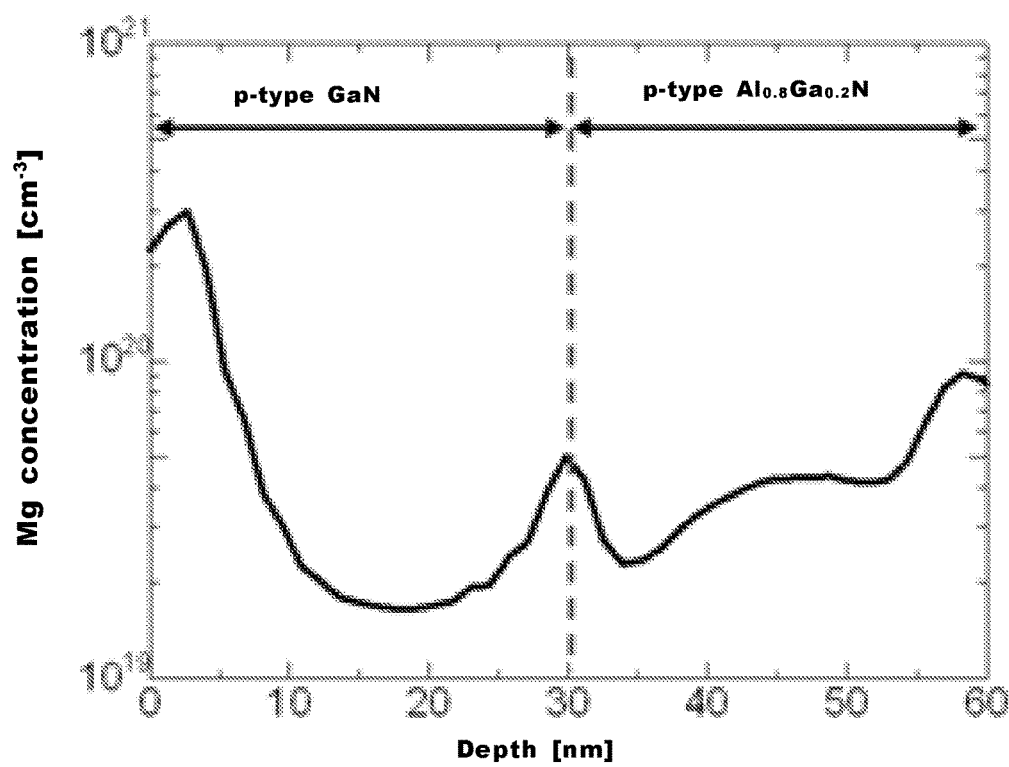
FIG. 2 is the Mg concentration profile (figure) in the p-type GaN layer of the group III nitride laminate of the example 1.

Further, as similar to the AlN single crystal substrate 1, using the high resolution X ray diffractometer, the $Al_XGa_{1-X}N$ layer (the single crystal buffer layer 2, the n-type layer 3, the active layer 4, the electron block layer 5 and the p-type layer 6), and the p-type GaN layer 7 were evaluated for the crystalline quality. As a result of XRD reciprocal lattice mapping measurement of (114) plane for the evaluation of the condition of the lattice relaxation of each layer, all of the lattice relaxation rate of the $Al_XGa_{1-X}N$ layer were 1.2% or less, and the lattice relaxation rate of the p-type GaN layer was 64.5%. Also, the full width at half maximum of X ray rocking curve of (002) plane and (102) plane of the p-type GaN layer were 80 seconds and 240 seconds respectively. Further, the dislocation density of the surface of the p-type GaN layer obtained from the cross section observation by transmission electron microscope (TEM) was $9 \times 10^9$ $cm^{-2}$. Also, the Mg concentration profile measured by SIMS is shown in FIG. 2. The average Mg concentration in the p-type GaN layer was about $1.9 \times 10^{19}$ $cm^{-3}$, and the Mg concentration near the boundary between the p-type $Al_{0.8}Ga_{0.2}N$ layer was $5.0 \times 10^{19}$ $cm^{-3}$. Note that, said average Mg concentration is the value obtained by excluding the area 10 nm from the surface, and 10 nm from the boundary between the p-type $Al_{0.8}Ga_{0.2}N$ layer 6.

(Group III Nitride Laminate: Formation of the n-electrode)

Next, part of the group III nitride laminate was etched from the p-type GaN layer side until the n-type $Al_{0.7}Ga_{0.3}N$ layer was exposed using ICP etching device, then Ti (20 nm)/ Al (100 nm)/ Ti (20 nm)/ Au (50 nm) electrode was formed on the exposed surface by a vacuum evaporation method, then the heat treatment was carried out under the condition of 900° C. in nitrogen atmosphere for 1 minute.

(Group III Nitride Laminate: Formation of the p-electrode)

Next, Ni (20 nm)/ Au (100 nm) electrode was formed on the above mentioned p-type GaN layer using a vacuum evaporation method, then the heat treatment was carried out under the condition of 500° C. in nitrogen atmosphere for 5 minutes.

(Production of the Luminescence Diode)

Next, the AlN seed substrate part was removed by mechanical polishing until the HVPE method AlN thick film part was exposed, thereby the luminescence diode wafer was completed (in this case, the HVPE method AlN thick film part corresponds to the AlN single crystal substrate 1). Here, the thickness of the HVPE method AlN thick film part (the AlN single crystal substrate 1) was 100 μm. The produced luminescence diode wafer was diced into plurality of chip form having the size of 800×800 μm, then flip chip bonded on the ceramic mount, thereby the luminescence diode.

(Evaluation of the Luminescence Diode)

The produced luminescence diode had the luminescence peak wavelength of 260 nm, and the luminescence output at the driving current of 100 mA was 14 mW. Also, to 30 luminescence diodes which were produced, the endurance test of 100 mA continuous current at a room temperature was carried out, as a result the number of broken chip such as short circuit or so within 500 hours was 0. Also, the ratio of the output after 500 hours with respect to output before the endurance test was 0.95 or more for all 30 chips evaluated. Also, the voltage increasing rate during the 100 mA current after 500 hours was 6.3%.

Example 2

The luminescence diode was produced as same as example 1 except for changing the AlN homoepitaxial layer 2 (the single crystal buffer layer) of the example 1 to the $Al_{0.7}Ga_{0.3}N$ layer (the single crystal buffer layer).

The $Al_{0.7}Ga_{0.3}N$ layer (the single crystal buffer layer) was formed to have a thickness of 0.05 μm by setting the substrate temperature to 1050° C., trimethyl aluminum flow amount to 4.4 trimethyl gallium flow amount to 8.9 μmol/min and ammonia flow amount to 1.5 slm, and the source material gas flow amount was regulated so that the V/III ratio at this time was 5050, further the total flow amount was 10 slm and the pressure was 50 mbar. Other conditions was made as same as the example 1, and the production was carried out up until the p-type GaN layer under the same condition as the example 1.

(Evaluation of the Group III Nitride Laminate)

The surface of the p-type GaN layer had RMS of 1.2 nm, and the hillock density measured by Nomarski microscope was 1.3/mm$^2$. Also, as a result of XRD reciprocal lattice mapping measurement of (114) plane, the lattice relaxation rate of the $Al_xGa_{1-x}N$ layer were all 0.9% or less, and the lattice relaxation rate of the p-type GaN layer was 58.4%. Also, the full width at half maximum of rocking curve of (002) plane and (102) plane were 74 seconds and 227 seconds respectively. Further, the dislocation density of the surface of the p-type GaN layer obtained by the cross section observation by transmission electron microscope (TEM) was $8.7 \times 10^9$ cm$^{-2}$. As similar to FIG. 2, the Mg concentration profile in the p-type GaN layer measured by SIMS had a peak at the area near the boundary between the p-type $Al_{0.8}Ga_{0.2}N$ layer. The Mg concentration in the p-type GaN layer was $2.0 \times 10^{19}$ cm$^{-3}$, and the Mg concentration near the boundary between the p-type $Al_{0.8}Ga_{0.2}N$ layer was $5.0 \times 10^{19}$ cm$^{-3}$.

(Evaluation of the Luminescence Diode)

The luminescence peak wavelength of the luminescence diode produced was 260 nm, and the luminescence output at the driving current of 100 mA was 13 mW. Also, the endurance test under the condition of 100 mA continuous current at room temperature was carried out to 30 luminescence diodes which were produced; as a result, the number of the chip which was broken such as having short circuit or so by 500 hours was 0. The ratio of the output after 500 hours with respect to the output before the endurance test was 0.95 or more for all 30 chips evaluated.

Also, the voltage increasing rate during the 100 mA current after 500 hours was 6.7%.

Example 3

The luminescence diode was produced as similar to the example 1 except that the AlN homoepitaxial layer 2 (the single crystal buffer layer) was not produced (i.e. except for forming the n-type layer directly on the AlN thick film).

(Evaluation of the Group III Nitride Laminate)

The surface of the p-type GaN layer had RMS of 2.1 nm, and the hillock density measured by Nomarski microscope was 1.8/mm$^2$. Also, as a result of XRD reciprocal lattice mapping measurement of (114) plane, the lattice relaxation rate of the $Al_xGa_{1-x}N$ layer were all 1.0% or less, and the lattice relaxation rate of the p-type GaN layer was 61.3%. Also, the full width at half maximum of rocking curve of (002) plane and (102) plane were 170 seconds and 272 seconds respectively. Further, the dislocation density of the surface of the p-type GaN layer obtained by cross section observation by transmission electron microscope (TEM) was $2.0 \times 10^{10}$ cm$^{-2}$. As similar to FIG. 2, the Mg concentration profile in the p-type GaN layer measured by SIMS had a peak at the area near the boundary between the p-type $Al_{0.8}Ga_{0.2}N$ layer. The Mg concentration in the p-type GaN layer was $2.0 \times 10^{19}$ cm$^{-3}$, and the Mg concentration near the boundary between the p-type $Al_{0.8}Ga_{0.2}N$ layer was $4.3 \times 10^{19}$ cm$^{-3}$.

(Evaluation of the Luminescence Diode)

The luminescence peak wavelength of the luminescence diode produced was 260 nm, and the luminescence output at the driving current of 100 mA was 14 mW. Also, the endurance test under the condition of 100 mA continuous current at room temperature was carried out to 30 luminescence diodes which were produced; as a result, the number of the chip which was broken such as having short circuit or so by 500 hours was 1. The ratio of the output after 500 hours with respect to the output before the endurance test was 0.90 or more for all 30 chips evaluated. Also, the voltage increasing rate during the 100 mA current after 500 hours was 8.7%.

Example 4

The luminescence diode was produced as same as the example 1 except that the thickness of the p-type GaN layer of example 1 was changed to 320 nm.

(Evaluation of the Group III Nitride Laminate)

The surface of the p-type GaN layer had RMS of 0.9 nm, and the hillock density measured by Nomarski microscope was 2/mm$^2$. Also, as a result of XRD reciprocal lattice mapping measurement of (114) plane, the lattice relaxation rate of the $Al_xGa_{1-x}N$ layer were all 1.2% or less, and the lattice relaxation rate of the p-type GaN layer was 71.0%. Also, the full width at half maximum of rocking curve of (002) plane and (102) plane were 88 seconds and 210 seconds respectively. Further, the dislocation density of the surface of the p-type GaN layer obtained by cross section observation by transmission electron microscope (TEM) was $1.1 \times 10^{10}$ cm$^{-2}$. As similar to FIG. 2, the Mg concentration profile in the p-type GaN layer measured by SIMS had a peak at the area near the boundary between the p-type $Al_{0.8}Ga_{0.2}N$ layer. The Mg concentration in the p-type GaN layer was $2.0 \times 10^{19}$ cm$^{-3}$, and the Mg concentration near the boundary between the p-type $Al_{0.8}Ga_{0.2}N$ layer was $5.2 \times 10^{19}$ cm$^{-3}$.

(Evaluation of the Luminescence Diode)

The luminescence peak wavelength of the luminescence diode produced was 260 nm, and the luminescence output at the driving current of 100 mA was 14 mW. Also, the endurance test under the condition of 100 mA continuous current at room temperature was carried out to 30 luminescence diodes which were produced; as a result, the number of the chip which was broken such as having short circuit or so by 500 hours was 0. The ratio of the output after 500 hours with respect to the output before the endurance test was 0.95 or more for all 30 chips evaluated. Also, the voltage increasing rate during the 100 mA current after 500 hours was 1.8%.

Comparative Example 1

The luminescence diode was produced as same as the example 1 except that the mixing ratio of nitrogen in the carrier gas when growing the p-type GaN layer was changed to 1.0.

(Evaluation of the Group III Nitride Laminate)

The surface of the p-type GaN layer had RMS of 4.86 nm, and the hillock density measured by Nomarski microscope was 5.1/mm$^2$. Also, as a result of XRD reciprocal lattice mapping measurement of (114) plane, the lattice relaxation rate of the $Al_xGa_{1-x}N$ layer were all 1.2% or less, and the lattice relaxation rate of p-type GaN layer was 82.0%. Also, the full width at half maximum of rocking curve of (002) plane and (102) plane were 209 seconds and 366 seconds respectively. Further, the dislocation density of the surface of the p-type GaN layer obtained by cross section observation by transmission electron microscope (TEM) was $7.7 \times 10^{10}$ cm$^{-2}$.

(Evaluation of the Luminescence Diode)

The luminescence peak wavelength of the luminescence diode produced was 260 nm, and the luminescence output at the driving current of 100 mA was 11 mW. Also, the endurance test under the condition of 100 mA continuous current at room temperature was carried out to 30 luminescence diodes which were produced; as a result, the number of the chip which was broken such as having short circuit or so by 500 hours was 4. The ratio of the output after 500 hours with respect to the output before the endurance test was 0.80 or more for 26 chips wherein the broken luminescence diode had been excluded.

NUMERICAL REFERENCES

1 AlN single crystal substrate
2 Single crystal buffer layer
3 n-type layer
4 Active layer
5 Electron block layer
6 p-type layer
7 p-type GaN layer
10 Group III nitride laminate

The invention claimed is:

1. A group III nitride laminate comprising a laminate structure wherein an $Al_XGa_{1-X}N$ layer ($0<X\leq1$) lattice-matched with an AlN single crystal substrate is stacked on said AlN single crystal substrate,
   a GaN layer having a thickness of 5 to 400 nm is stacked on said $Al_XGa_{1-X}N$ layer ($0<X\leq1$), and
   a dislocation density of said GaN layer is less than $5\times10^{10}$ $cm^{-2}$, or a full width at half maximum of X ray omega rocking curve of (002) plane and that of (102) plane of said GaN layer are 50 to 300 seconds,
   wherein a lattice relaxation rate of said GaN layer is less than 75%.

2. The group III nitride laminate as set forth in claim 1, wherein said $Al_XGa_{1-X}N$ layer ($0<X\leq1$) comprises plurality of layers, and among said plurality of layers, a layer to which said GaN layer is directly stacked is $Al_ZGa_{1-Z}N$ layer ($0<Z\leq1$), and
   said laminate structure comprises $Al_YGa_{1-Y}N$ layer ($0.7\leq Y\leq1$) between said AlN single crystal substrate and said $Al_ZGa_{1-Z}N$ layer ($0<Z\leq1$).

3. The group III nitride laminate as set forth in claim 1, wherein said GaN layer comprises Mg, and at a boundary between said GaN layer and $Al_XGa_{1-X}N$ layer ($0<X\leq1$) where said GaN layer is directly stacked, a Mg concentration profile is at peak.

4. The group III nitride laminate as set forth in claim 1, wherein said AlN single crystal substrate has 25 $cm^{-1}$ or less of an absorption coefficient at a wavelength of 210 nm or more.

5. A luminescence element comprising the group III nitride laminate as set forth in claim 1 having a luminescence peak wavelength of 210 to 350 nm.

6. The group III nitride laminate as set forth in claim 1, wherein a lattice relaxation rate of said GaN layer is about 30% to 65%.

7. The group III nitride laminate as set forth in claim 1, wherein said $Al_XGa_{1-X}N$ layer ($0<X\leq1$) has plurality of layers stacked in the order of the n-type layer, active layer, and p-type layer from the AlN single crystal substrate side, and the GaN layer is directly stacked on the p-type layer.

8. The group III nitride laminate as set forth in claim 1, wherein said dislocation density of said GaN layer is less than $1\times10^{10}$ $cm^{-2}$.

9. The group III nitride laminate as set forth in claim 1, wherein said dislocation density of said GaN layer is less than $5\times10^9$ $cm^{-2}$.

10. The group III nitride laminate as set forth in claim 1, wherein said $Al_XGa_{1-X}N$ layer ($0<X\leq1$) has plurality of layers, and said layers are lattice-matched with the AlN single crystal substrate.

* * * * *